(12) United States Patent
Shiramizu et al.

(10) Patent No.: US 9,948,335 B2
(45) Date of Patent: Apr. 17, 2018

(54) SIGNAL PROCESSING DEVICE, CONTROL METHOD THEREOF, CONTROL PROCEDURE AND RECORDING MEDIUM

(71) Applicant: OMRON Corporation, Kyoto (JP)

(72) Inventors: Gaku Shiramizu, Ayabe (JP); Ziqiang Xu, Kasatsu (JP)

(73) Assignee: OMRON Corporation, Kyoto (JP)

(*) Notice: Subject to any disclaimer, the term of this patent is extended or adjusted under 35 U.S.C. 154(b) by 0 days.

(21) Appl. No.: 15/381,130

(22) Filed: Dec. 16, 2016

(65) Prior Publication Data

US 2017/0222674 A1    Aug. 3, 2017

(30) Foreign Application Priority Data

Jan. 29, 2016    (JP) ................................. 2016-016350

(51) Int. Cl.
  *H04B 1/10*    (2006.01)
  *H04L 29/08*    (2006.01)
  *G01G 23/10*    (2006.01)
  *H03H 17/02*    (2006.01)

(52) U.S. Cl.
  CPC ........... *H04B 1/1036* (2013.01); *G01G 23/10* (2013.01); *H04L 67/12* (2013.01); *H03H 17/026* (2013.01); *H03H 17/0294* (2013.01); *H03H 2017/0297* (2013.01)

(58) Field of Classification Search
  CPC ................................................. H03H 17/0294
  See application file for complete search history.

(56) References Cited

FOREIGN PATENT DOCUMENTS

| EP | 0908706 |    | 4/1999  |             |
|----|---------|----|---------|-------------|
| EP | 0908706 | A1 * | 4/1999 | ........... G01G 3/1414 |
| EP | 1363112 |    | 11/2003 |             |
| EP | 1363112 | A1 * | 11/2003 | ............ G01G 3/147 |
| EP | 1736748 |    | 12/2006 |             |
| EP | 2012429 |    | 1/2009  |             |
| EP | 2202498 |    | 6/2010  |             |
| JP | 2014-153234 |  | 8/2014 |             |

OTHER PUBLICATIONS

"Search Report of Europe Counterpart Application", dated Jun. 23, 2017, p. 1-p. 7.

* cited by examiner

*Primary Examiner* — Ross Varndell
(74) *Attorney, Agent, or Firm* — JCIPRNET

(57) ABSTRACT

The invention relates to a signal processing device, a control method thereof, a control procedure and a recording medium, which is unnecessary to increase a memory capacity for implementing sampling to determine a filter parameter. The signal processing device includes a data acquiring element (10), acquiring signals of a time series, i.e. time series signals from a sensor; a filtering element (21), performing a filtering operation according to frequencies; a transfer element (30), transferring the time series signals; and a filter parameter determination element (50), performing frequency analysis to the time series signals within a pre-specified interval, i.e. a specified interval to determine a filter parameter.

11 Claims, 7 Drawing Sheets

SIGNAL PROCESSING DEVICE, CONTROL METHOD THEREOF, CONTROL PROCEDURE AND RECORDING MEDIUM

CROSS-REFERENCE TO RELATED APPLICATION

This application claims the priority benefit of Japanese application serial no. 2016-016350, filed on Jan. 29, 2016. The entirety of the above-mentioned patent application is hereby incorporated by reference herein and made a part of this specification.

BACKGROUND OF THE INVENTION

Field of the Invention

The invention relates to a signal processing device, etc., capable of filtering measuring data received from a measuring device and transferring the same to a control device.

Description of Related Art

A known signal processing device is adapted to acquire a physical quantity measured by a sensor installed in industrial machinery such as a measuring device, etc., and perform signal processing to the acquired detection signal, and transfer the signal to a control device used for controlling the industrial machinery. The signal processing device may amplify an analog signal acquired from the sensor, and convert the analog signal into a digital signal by using an analog-to-digital (AD) converter, and transfer the digital signal to the control device. Moreover, the signal processing device uses a digital filter to filter a noise in the digital signal, and sends the filtered digital signal to the control device.

In a control system including the signal processing device, measuring objects (generally referred to as works) measured by a measuring device are diversified, and the noises generated corresponding to the measuring objects are also different. Therefore, the noises to be eliminated by the signal processing device are not necessarily the same, and each time a frequency of the noise to be eliminated has to be set corresponding to the measuring object.

Moreover, a patent literature 1 discloses a following technique: in a measuring device, a motor speed signal is taken as a base frequency, and amplitude of a specified frequency obtained by multiplying the base frequency by a multiplying power is used to determine an abnormal state. According to such technique, the motor speed signal can be used to determine the abnormal state, such that even the measuring object is changed, the abnormal state can still be easily determined.

EXISTING TECHNICAL LITERATURE

Patent Literature

Patent literature 1: Japan patent publication No. 2014-153234 (published on Aug. 25, 2014)

SUMMARY OF THE INVENTION

Problem to be Resolved by the Invention

In case that signals are acquired in order to determine the frequencies of the noises to be eliminated, a sampling frequency has a high possibility to become high. This is because that if the sampling is not performed at a frequency that is twice or more than twice of the frequency to be measured, other vibration with a low period is produced to become another noise.

Therefore, for example, in order to sample a high frequency vibration such as a mechanical vibration, a rather high sampling frequency is required. However, in case that the sampling frequency is increased to perform the sampling and sampling data is recorded, a data amount becomes larger, and a memory capacity is probably not satisfactory.

In the prior art, the memory capacity issue occurred when the sampling frequency is set high is not mentioned, so that the problem cannot be resolved.

In order to resolve the aforementioned problem, the invention provides a signal processing device, etc., by which even the sampling frequency required for determining the noises to be eliminated becomes higher, the sampling can still be performed to determine a filter parameter without increasing the required memory capacity.

Technical Means for Resolving the Problem

In order to resolve the aforementioned problem, the invention provides a signal processing device to filter signals coming from a sensor and transfer the signals to a control device. The signal processing device includes a data acquiring element, periodically acquiring the signals coming from the sensor, so as to obtain the signals of a time series, i.e. time series signals; a filter element, filtering the time series signals acquired by the data acquiring element according to frequencies; a transfer element, transferring the time series signals filtered by the filter element to the control device; and a filter parameter determination element, performing frequency analysis to the time series signals within a pre-specified interval, i.e. a specified interval to determine a filter parameter of the filter element, and the filter element executes the filtering operation by using the filter parameter determined by the filter parameter determination element.

According to the above structure, the filter parameter can be determined by using the time series signals within the specified interval and coming from the sensor, so that the filter parameter can be determined according to proper signals except the noises.

Moreover, in order to properly determine the filter parameter, a period for acquiring the signals (a sampling frequency) has to be set high, though if the sampling frequency is increased, the data amount is increased. According to such structure, since an interval for acquiring the signals is specified, compared to the situation of acquiring the time series signals without specifying the interval, the data amount is suppressed, so as to mitigate a processing load.

The signal processing device of the invention includes a sensor data sending element, sending sensor data representing the signals of the time series coming from the sensor to an external device, where the external device has a specification accepting element accepting specification of the specified interval from a user; and a specified interval acquiring element, acquiring the specified interval specified based on the sensor data from the external device, where the filter parameter determination element uses the time series signals within the specified interval acquired by the specified interval acquiring element to determine the filter parameter.

According to the above structure, the specified interval can be specified, so that an interval required by the user can be set as the specified interval. Therefore, the interval properly excluding the noises can be set as the specified interval. Accordingly, the filter parameter can be properly determined.

In an embodiment of the invention, in the signal processing device, the filter parameter determination element uses the time series signals within the specified interval specified by the control device to determine the filter parameter.

According to the above structure, the specified interval can be specified through the control device. Therefore, as long as the interval except a noise interval is set as the specified interval, and the specified interval is pre-stored in the control device, the time series signals within the proper specified interval can be used to determine the filter parameter according to an instruction of the control device.

In an embodiment of the invention, the signal processing device determines whether to apply the filter parameter determined by the filter parameter determination element to the filter element.

According the above structure, the user may determine whether to apply the filter parameter determined by the filter parameter determination element to the filter element.

In an embodiment of the invention, in the signal processing device, the filter parameter represents at least one of a type of a filter and a setting value applied to the filter for implementing the filtering operation.

According to the above structure, the type of the applied filters and the setting value applied to the filters for implementing the filtering operation can be respectively determined according to the filter parameter.

In an embodiment of the invention, in the signal processing device, the filter element has a plurality of filters, and the signal processing device respectively determine whether to execute the filtering operation for the plurality of filters.

According to the above structure, whether each of the filters executes the filter operation can be determined by the user. In this way, the filter operation can be executed only through the filters required by the user.

In an embodiment of the invention, in the signal processing device, the filter element has moving average filters.

According to the above structure, the filtering operation can be performed through the moving average filter, so that besides the noise of the required frequency, noises with integer multiple frequencies of the frequency can also be suppressed.

In an embodiment of the invention, in the signal processing device, the filter parameter determination element takes a quotient of a period that the data acquiring element acquires the signals divided by a peak frequency of a frequency characteristic obtained by performing the frequency analysis to the signals of the time series acquired by the data acquiring element as an adding number of times of the moving average filters.

According to the above structure, since the quotient obtained by dividing the signal acquiring period (the sampling frequency) by the peak frequency of the frequency characteristic is set as the adding number of times of the moving average filters, the noise can be properly suppressed. This is because that by setting the quotient obtained by dividing the sampling frequency by the peak frequency of the frequency characteristic as the adding number of times of the moving average filters, the frequency of the noise is counteracted.

In order to resolve the aforementioned problem, the invention provides a control method of a signal processing device to filter signals coming from a sensor and transfer the signals to a control device. The control method of the signal processing device includes: a data acquiring step, periodically acquiring the signals coming from the sensor, so as to obtain the signals of a time series, i.e. time series signals; a filtering step, filtering the time series signals acquired in the data acquiring step according to frequencies; and a transfer step, transferring the time series signals filtered in the filtering step to the control device. The control method of the signal processing device further includes a filter parameter determination step, performing frequency analysis to the time series signals within a pre-specified interval i.e. a specified interval to determine a filter parameter for the filtering operation of the filtering step, and in the filtering step, the filtering operation is executed by using the filter parameter determined in the filter parameter determination step.

According to the above structure, an effect similar to the aforementioned effect is achieved.

The signal processing device can be implemented through a computer. In this case, the computer can be used as various elements (software elements) of the signal processing device, such that the signal processing device implemented by the computer, a control procedure of the signal processing device, and a recording medium recording the control procedure and readable by the computer also belong to a protection scope of the invention.

Effect of the Invention

According to the invention, the filter parameter can be determined by using the time series signals coming from the sensor and within the specified interval, so that the following effect is achieved: proper signals except the noises can be used to determine the filter parameter.

Moreover, in order to properly determine the filter parameter, the signal acquiring period (the sampling frequency) has to be set high, though if the sampling frequency is increased, the data amount is increased. According to such structure, since an interval for acquiring signals is specified, compared to the situation of acquiring the time series signals without specifying the interval, the data amount is suppressed, such that a processing load is mitigated.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2(a) illustrates a situation that setting of a filter parameter is performed by a user through a specifying device 4, and FIG. 2(b) illustrates a situation that the filter parameter is automatically set in a load cell interface unit 1.

DESCRIPTION OF EMBODIMENTS

Embodiment 1

Overall Overview

Figure 2A:
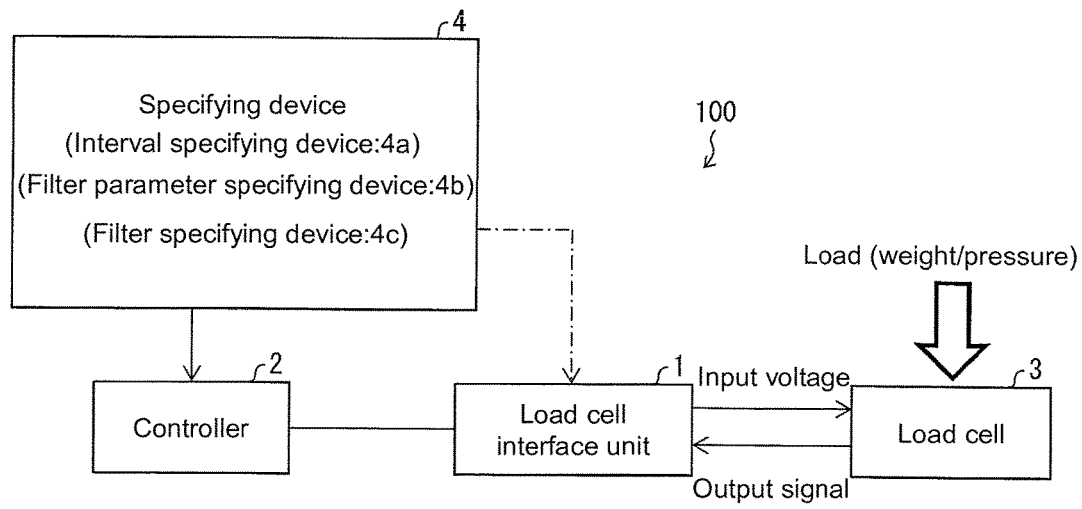
FIG. 2(a) and FIG. 2(b) are schematic diagrams of a measuring system 100 according to an embodiment 1 of the invention.
Figure 2B:
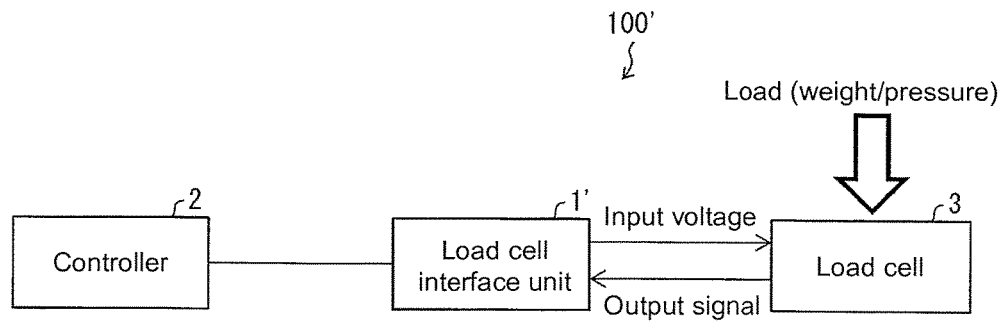

First, referring to FIG. 2 for a measuring system 100 of the present embodiment. FIG. 2(a) and FIG. 2(b) are schematic diagrams of the measuring system 100 according to the embodiment 1 of the invention. FIG. 2(a) illustrates a situation that setting of a filter parameter is performed by a user through a specifying device 4, and FIG. 2(b) illustrates a situation that the filter parameter is automatically set in a load cell interface unit 1.

As shown in FIG. 2(a), the measuring system 100 of the present embodiment includes a load cell interface unit (signal processing device) 1, a controller (control device) 2, a load cell (sensor) 3 and the specifying device 4. The controller 2 uses the load cell 3 to measure a weight (or pressure) of a load of a work (measuring object), and controls the work according to a measuring result. Moreover, in the measuring system 100, an output signal within a specified interval and output by the load cell 3 is used to set the filter parameter in the load cell interface unit 1.

In order to set the filter parameter, it is unnecessary to log in (record) all of the output signals of the load cell 3. Therefore, even in case of a high sampling frequency, the output signals can be logged in (recorded) without using a memory with a huge capacity.

The controller 2 is used for controlling the measuring system 100, which is, for example, programmable logic controller (PLC). The controller 2 calculates the weight (or pressure) of the load of the measuring object according to the output signal of the load cell 3 obtained through the load cell interface unit 1, and controls the load.

The load cell interface unit 1 amplifies the output signal of the load cell 3 acquired from the load cell 3, and performs an AD conversion (analog-to-digital conversion) and a filtering operation to the output signal, and sends a result thereof to the controller 2. Moreover, the load cell interface unit 1 directly or indirectly sends the output signal acquired from the load cell 3 to the specifying device 4 in terms of an interval specifying output signal. Moreover, the load cell interface unit 1 is described in detail later.

The specifying device 4 accepts an interval specification used for setting the filter parameter of a filter element 21 of the load cell interface unit 1, and sends the accepted specified interval to the load cell interface unit 1.

Moreover, the specifying device may also serve as all of or any two of aftermentioned interval specifying device 4a, a filter parameter specifying device 4b and a filter specifying device 4c. In this case, the specifying device may implement a function of the interval specifying device 4a, a function of the filter parameter specifying device 4b and a function of the filter specifying device 4c.

As described above, in the measuring system 100, according to an instruction of the controller 2, the load cell interface unit 1 supplies an input voltage to the load cell 3. Then, the load cell interface unit 1 acquires the output signal of the load cell 3 (a data acquiring step), and amplifies the same, and performs the AD conversion (analog-to-digital conversion) and the filtering operation (filtering step) to the output signal for transferring to the controller 2 (transfer step). The controller 2 that acquires the filtered output signal from the load cell interface unit 1 calculates a measuring value of the measuring object according to the output signal, and performs corresponding control.

Moreover, the load cell interface unit 1 uses the output signal within the specified interval to determine the filter parameter used for the filtering operation (a filter parameter determination step).

(The Load Cell)

The load cell 3 of the present embodiment is schematically described below. The load cell 3 generally includes a Wheatstone bridge circuit using a strain gauge, where a resistance of the strain gauge is changed along with variation of an applied load (weight or pressure), and the output voltage is accordingly varied. The controller 2 derives the measuring value according to the variation of the output voltage (output signal).

The load cell 3 is, for example, a platform weighing system, a quantitative cut out control system or a press-in system, and the present embodiment is adapted to any one of the above systems.

Regarding the platform weighing system, a measuring object is adapted to be placed on a weighing platform, so as to measure a weight of the measuring object. A plurality of load cells is installed under the weighting platform, and respectively output signals thereof are input to a unit referred to as a junction box that is adapted to sum the output signals of the load cells. A summation (summing value) of the output signals output from the junction box is sent to the controller through the load cell interface unit, and the controller derives a weight value according to the summing value.

The quantitative cut out control system is a system adapted to measure a weight of a material thrown in a hopper, and expel the material to a container. The weight of the material in the hopper is measured on one hand, and a throw-in valve is controlled in a sequence of a large throw-in→a middle throw-in→a small throw-in on the other hand. A plurality of the load cells are installed at a position adapted to measure a weight of the hopper, and the respective output signals thereof are input to the junction box, and the summation (summing value) of the output signals output from the junction box is sent to the controller through the load cell interface unit, and the controller derives the measuring value according to the summing value, so as to control the hopper.

The press-in system refers to a system adapted to produce a product where two parts are bonded by pressing in. For example, a servo driver is adopted to apply a load to the parts to implement pressing in. The load cell can be installed at a position adapted to measure the load, and whether the product is acceptable is determined according to whether the load measured by the load cell is proper.

(The Load Cell Interface Unit)

Figure 1:
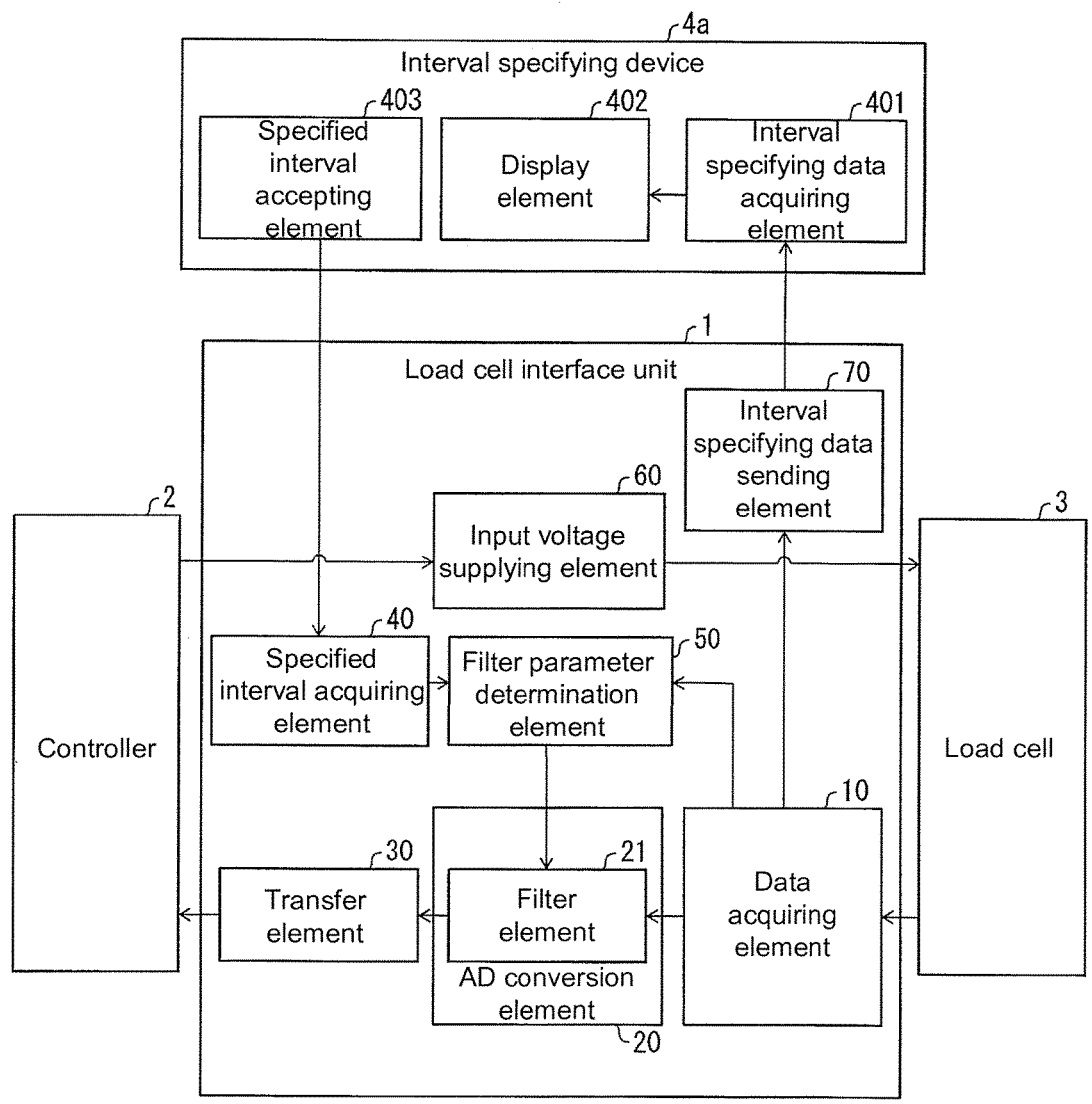
FIG. 1 is a block diagram of a main structure of a load cell interface unit 1.

Referring to FIG. 1 to describe a detailed structure of the load cell interface unit 1, and FIG. 1 is a block diagram of a main structure of the load cell interface unit 1. As shown in FIG. 1, the load cell interface unit 1 includes a data acquiring element 10, an AD conversion element 20, a transfer element 30, a specified interval acquiring element (specification accepting element) 40, input voltage supplying element 60 and an interval specifying data sending element (sensor data sending element) 70. The AD conversion element 20 includes a filter element 21.

The data acquiring element 10 periodically acquires an output signal from the load cell 3, and sends the output signal to the AD conversion element 20. Moreover, since the data acquiring element 10 periodically acquires an output signal from the load cell 3, the data acquiring element 10 finally acquires output signals of a time series (time series signals).

The AD conversion element 20 converts the output signal of the load cell 3 acquired from the data acquiring element 10 into digital data from analog data, and uses the filter element 21 to perform digital filtering to the digital data. Then, the digital-filtered output signal of the load cell 3 is sent to the transfer element 30. Moreover, a type and amount of filters in the filter element 21 is not limited by the invention, for example, the filter can be a low pass filter, a moving average filter, a notch filter, etc.

Moreover, since the notch filter only removes a removing frequency, in case that an integer multiple frequency of the removing frequency is to be removed, another notch filter has to be prepared, though the moving average filter may also remove the integer multiple frequency of the removing frequency, so that the moving average filter is ideal. Moreover, number of the moving average filter and the number of the notch filter can be plural, and by applying a plurality of the moving average filters or the notch filters, following advantages are achieved:

Generally, in the measuring system, a measuring result probably has an error due to a mechanical vibration and an electrical noise in the measurement. Especially, the measuring value sometimes is unstable due to the mechanical vibration of a mechanical system in the measuring system, and an inherent vibration of a measuring object. Moreover, considering that these external interferences (the mechanical vibration of the mechanical system, and the inherent vibration of the measuring object) can be overlapped, a plurality of digital filters connected in series can be inserted to eliminate the influences, so as to properly eliminate the influences.

The transfer element 30 transfers the digital-filtered output signal of the load cell 3 that is output by the AD element 30 to the controller 2.

The specified interval acquiring element 40 acquires an interval specified by the interval specifying device 4a, and notifies the interval to a filter parameter determination element 50.

The filter parameter determination element 50 uses the output signals of the load cell 3 that is sent by the data acquiring element 10 and within the specified interval notified by the specified interval acquiring element 40 to determine the filter parameter, and sets the filter parameter to the filter element 21.

To be specific, the filter parameter determination element 50 performs frequency analysis (for example, fast Fourier transform (FFT)) to the output signal of the load cell 3 within the specified interval notified by the specified interval acquiring element 40 to derive a frequency to be removed, so as to determine the filter parameter. Moreover, the filter parameter determination element 50 notifies the determined filter parameter to the controller 2 or the specifying device 4, and when the controller 2 or the specifying device 4 accepts an instruction for adopting the filter parameter from the user, the filter parameter determination element 50 sets the determined filter parameter to the filter element 21.

Moreover, the filter parameter is, for example, an adding number of times of the moving average filter.

The input voltage supplying element 60 supplies an input voltage to the load cell 3 according to an instruction of the controller 2.

The interval specifying data sending element 70 directly or indirectly sends the output signal of the load cell 3 that is sent by the data acquiring element 10 to the interval specifying device 4a in terms of interval specifying data (sensor data).

(The Interval Specifying Device)

The interval specifying device 4a is a device used for specifying an interval used for setting the filter parameter of the filter element 21, which includes an interval specifying data acquiring element 401, a display element 402 and a specified interval accepting element 403.

The interval specifying data acquiring element 401 displays the interval specifying data sent by the interval specifying data sending element 70 on the display element 402.

The display element 402 is a display device for display data.

The specified interval accepting element 403 accepts interval specification from the user, and notifies accepting content to the load cell interface unit 1. To be specific, the user observes interval specifying data (waveform) displayed on the display element 402 to determine an ideal interval for setting the filter parameter. Then, the specified interval accepting element 403 accepts the interval specification determined by the user.

In this way, the user may observe the actual measuring data, i.e. the waveform of the interval specifying data to determine the interval that is proper for the setting of the filter parameter. Therefore, an interval that is improper for the setting of the filter parameter cannot be set as the specified interval. Therefore, in the load cell interface unit 1, it is prevented to store improper intervals for the setting of the filter parameter in order to set the filter parameter, such that increase of the required memory in the load cell interface unit 1 can be suppressed.

(Whether to Adopt the Filter Parameter)

Figure 3:
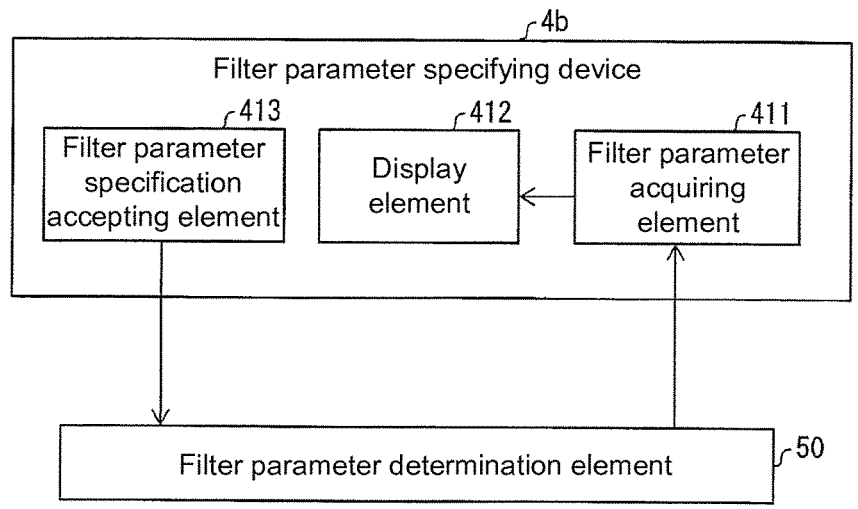
FIG. 3 is a block diagram of a main structure of a filter parameter specifying device 4b.

Referring to FIG. 3 for description of a following structure: whether the filter parameter calculated by the filter parameter determination element 50 is adopted is determined by the instruction of the user.

FIG. 3 is a block diagram of a main structure of the filter parameter specifying device 4b. The filter parameter specifying device 4b includes a filter parameter acquiring element 411, a display element 412 and a filter parameter specification accepting element 413. The filter parameter calculated by the filter parameter determination element 50 is displayed on the display element 412, and whether the filter parameter is adopted is determined by the instruction of the user, and a result thereof is notified to the load cell interface unit 1. In this way, the user may determine whether to adopt the filter parameter calculated by the load cell interface unit 1, and in case that the filter parameter calculated by the filter parameter determination element 50 is improper, the filter parameter is not adopted.

The filter parameter acquiring element 411 acquires the filter parameter calculated by the filter parameter determination element 50, and displays the same on the display element 412. The display element 412 is used for displaying information. Moreover, as described later, in case that the filter parameter specifying device 4b and the interval specifying device 4a are implemented by the same device, the display element 412 can be a same display element with that of the display element 402.

The filter parameter specification accepting element 413 is instructed by the user to determine whether to adopt the filter parameter that is acquired by the filter parameter acquiring element 411 and calculated by the filter parameter determination element 50, and notifies a result thereof to the load cell interface unit 1 (the filter parameter determination element 50). In case that the result of adopting the filter parameter is notified, the filter parameter determination element 50 sets the calculated filter parameter to the filter element 21. Moreover, in case that the result of not adopting the filter parameter is notified, the filter parameter determination element 50 again calculates the filter parameter.

Moreover, the filter parameter specifying device 4b implemented by an independent device is taken as an example for description, though the filter parameter specifying device 4b is not limited thereto, and the filter parameter specifying device 4b can be implemented by the same device as that of the interval specifying device 4a.

(Filter Specification)

Figure 4:
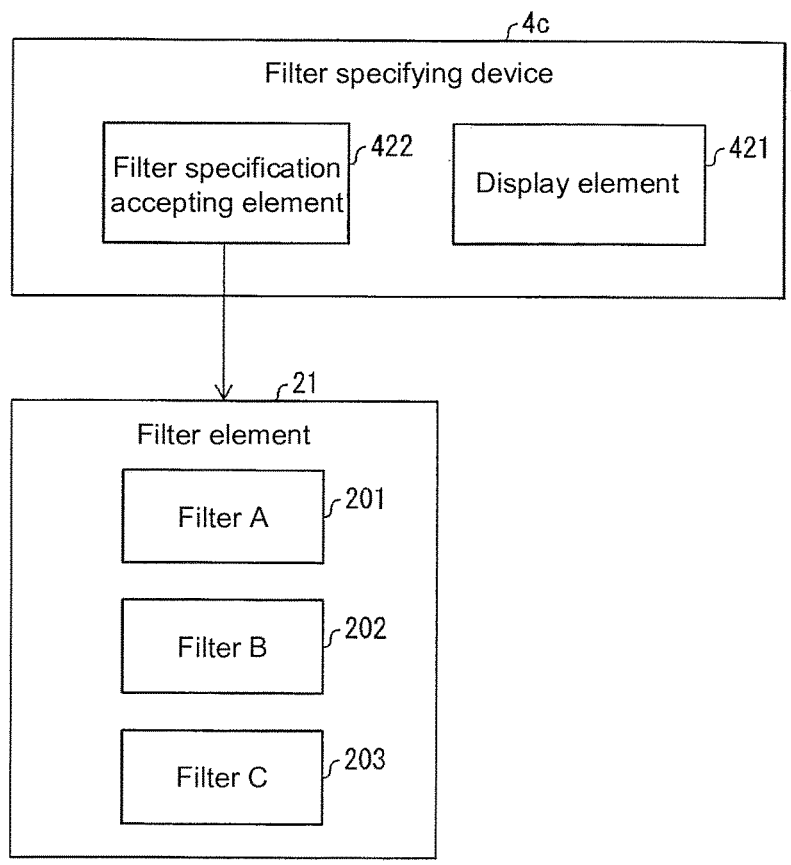
FIG. 4 is a block diagram of a main structure of the filter specifying device 4c.

Referring to FIG. 4 for description of a following structure: in case that the filter element 21 includes a plurality of filters, each of the filters may select whether to execute filtering.

FIG. 4 is a block diagram of a main structure of the filter specifying device 4c. As shown in FIG. 4, the filter specifying device 4c includes a display element 421 and a filter specification accepting element 422. The display element 421 is used for displaying info' nation, for example, displaying respective states of a plurality of filters contained in the filter element 21. Moreover, as described later, in case that the filter specifying device 4c is implemented by the same device as that of the interval specifying device 4a and the filter parameter specifying device 4b, the display element 421 can be a same display element with that of the display element 402 and the display element 412.

Regarding a plurality of filters (a filter 201 (for example, a low pass filter), a filter 202 (for example, a moving average filter), and a filter 203 (for example, a moving average filter)) contained in the filter element 21, the filter specification accepting element 422 respectively accepts on/off instructions (whether to execute the filtering operation) from the user, and turns on/off the filters contained in the filter element 21 according to the on/off instructions. In case that the filter element 21 includes a plurality of filters, the filtered frequencies are probably different according to the measuring objects (works). According to the present embodiment, since the filters can be turned on/off, the necessary filters can be turned on (to execute the filtering operation) if necessary.

Moreover, the filter specifying device 4c implemented by an independent device is taken as an example for description, though the filter specifying device 4c is not limited thereto, and the filter specifying device 4c can be implemented by the same device as that of the interval specifying device 4a and the filter parameter specifying device 4b, and can be implemented by the same device as that of any of the interval specifying device 4a and the filter parameter specifying device 4b.

(Processing Flow for Setting the Filter Parameter)

Figure 5:
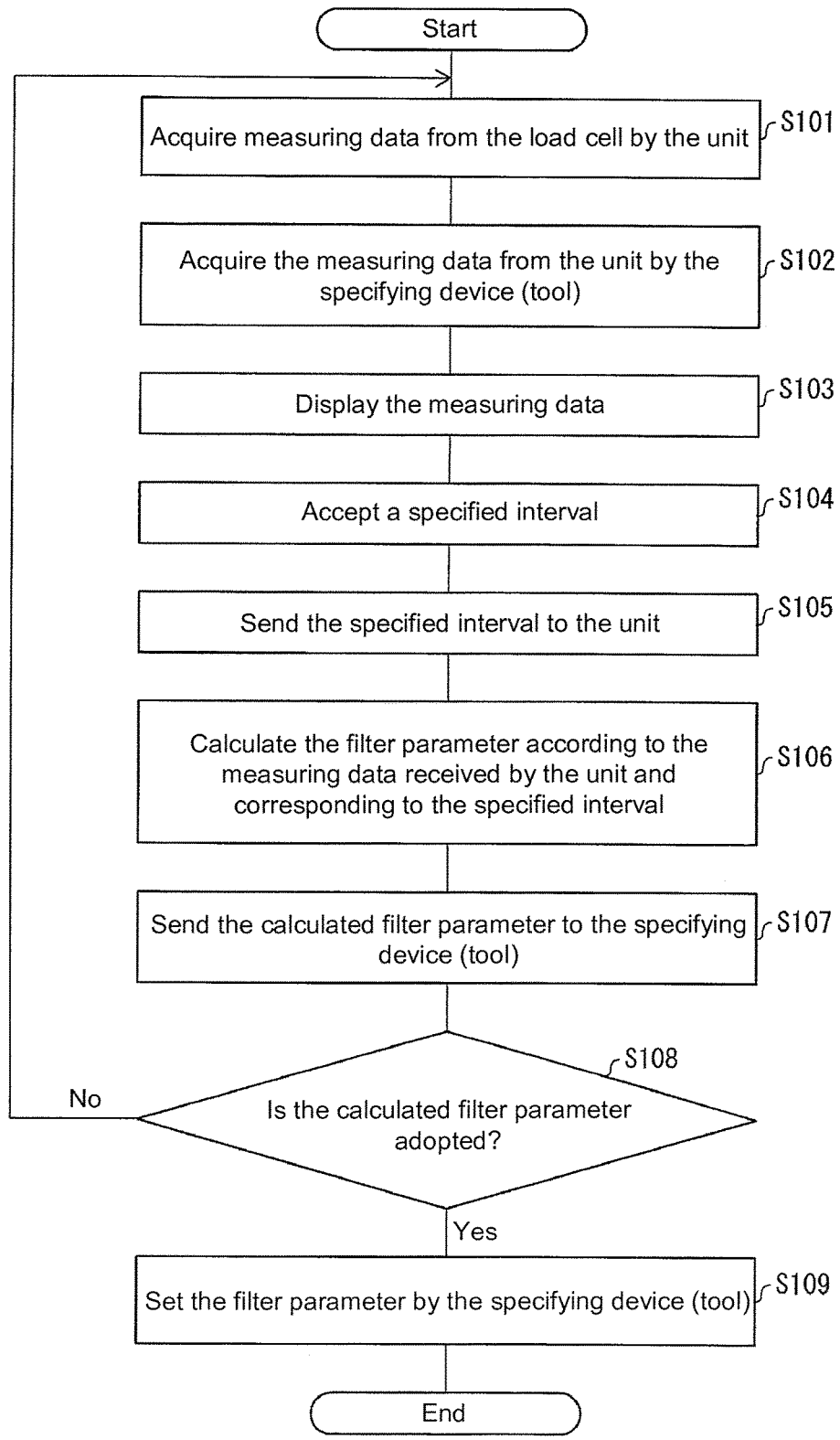
FIG. 5 is a flowchart illustrating a processing flow for setting a filter parameter.

Referring to FIG. 5 for the processing flow for setting the filter parameter, and FIG. 5 is a flowchart illustrating a processing flow for setting the filter parameter.

As shown in FIG. 5, first, the load cell interface unit 1 acquires measuring data (output signal) from the load cell 3 (S101). Then, the interval specifying device 4a acquires the measuring data from the load cell interface unit 1 (S102). The interval specifying device 4a has an application (referred to as a tool) used for setting the filter parameter, and the tool is adopted to execute interval specification used for setting the filter parameter. The interval specifying device 4a that acquires the measuring data displays the measuring data on the display element 402 (step S103). Then, specification of the interval used for setting the filter parameter is accepted from the user (S104). Then, the interval specifying device 4a notifies the accepted interval (the specified interval) to the load cell interface unit 1 (step S105).

The filter parameter determination element 50 in the load cell interface unit 1 that receives the notified specified interval from the interval specifying device 4a uses the measuring data corresponding to the specified interval to calculate the filter parameter (S106). Then, the calculated filter parameter is sent to the interval specifying device 4a (S107). The interval specifying device 4a displays the filter parameter calculated by the load cell interface unit 1 on the display element 402, and it is determined whether to adopt the filter parameter according to the instruction of the user (S108). Then, in case that the instruction of adopting the filter parameter is accepted ("YES" in the step S108), such result is notified to the load cell interface unit 1, and the load cell interface unit 1 sets the filter parameter to the filter element 21 (S109).

On the other hand, in the step S108, in case that the filter parameter calculated by the load cell interface unit 1 is not adopted ("NO" in the step S108), the flow returns to the step S101.

The processing flow for setting the filter parameter is described above.

(Example for Setting the Filter Parameter)

Figure 6:
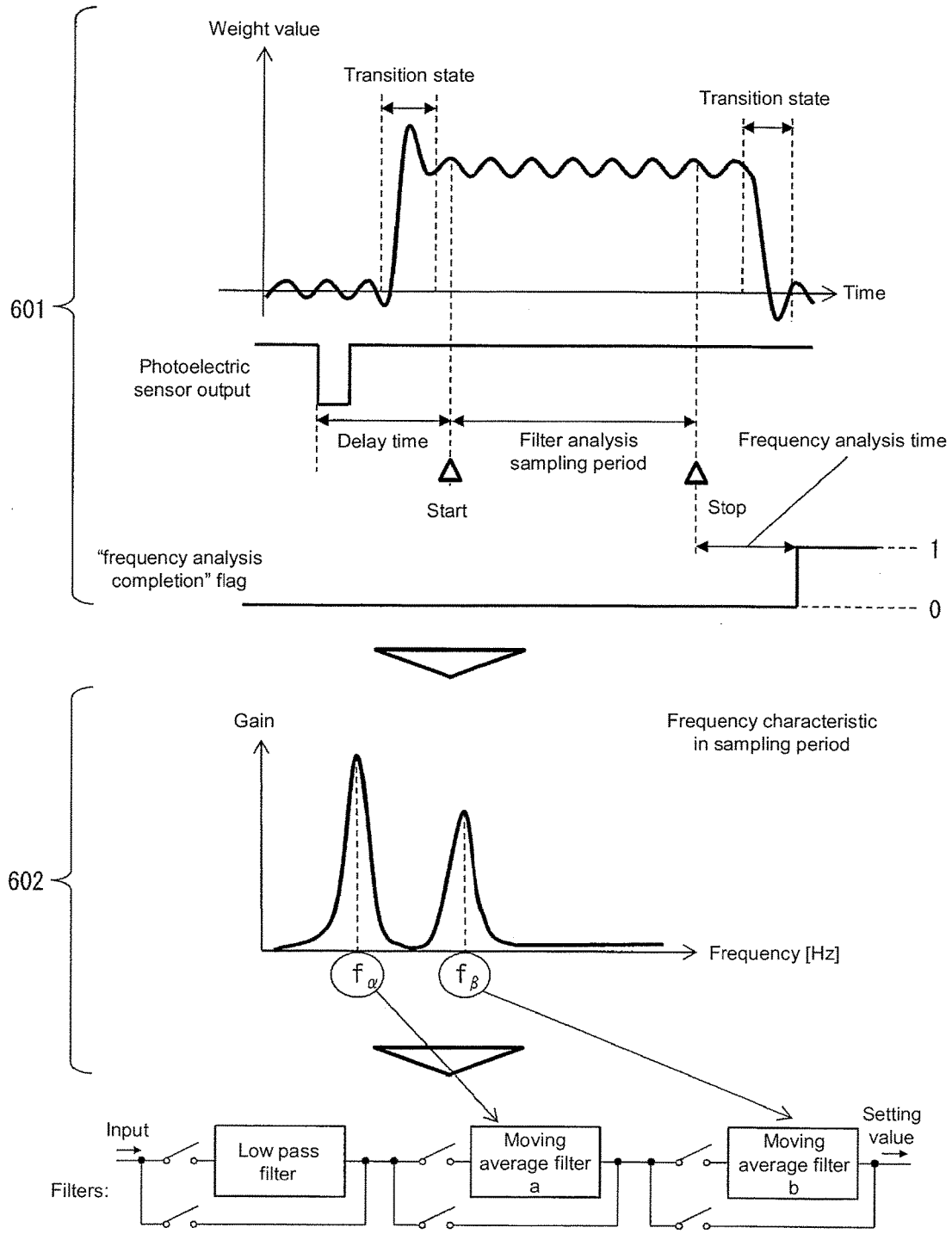
FIG. 6 is a diagram illustrating an example for setting the filter parameter.

Referring to FIG. 6 for an example for setting example of the filter parameter. FIG. 6 is a diagram illustrating an example for setting the filter parameter. A description partition 601 of FIG. 6 represents states of the output signal coming from the load cell 3, the specified interval specified by the interval specifying device 4a, a photoelectric sensor output, and a frequency analysis completion flag.

The output signal coining from the load cell 3 is represented by a graph with a vertical axis representing weight value and a horizontal axis representing time. Moreover, the specified interval specified by the interval specifying device 4a is represented by a filter analysis sampling period from "start" to "end". Moreover, the photoelectric sensor output indicates whether the measuring object (work) is located at a measuring position. Moreover, the frequency analysis completion flag indicates whether frequency analysis is completed, i.e. whether calculation of the filter parameter is completed. When the frequency analysis completion flag is "1", it represents that the frequency analysis is completed.

The frequency analysis is performed the measuring data within the filter analysis sampling period and shown in the description partition 601, and a result thereof is shown in a description partition 602. As shown in the description partition 602, according to the result of the frequency analysis, it is known that gain peaks are achieved in a frequency $f_a$ and a frequency $f_\beta$.

In collaboration with the peaks, filters such as the low pass filter, the moving average filter for the frequency $f_a$ and the moving average filter b for the frequency $f_\beta$ are configured. Moreover, the filter parameter such as the adding number of times of the moving average filter a and the moving average filter b can be set according to the gains of the peaks.

To be specific, a quotient of a period (sampling frequency) that the data acquiring element 10 acquires the output signal divided by a peak frequency ($f_a$ or $f_\beta$) of a frequency characteristic obtained by performing the frequency analysis (FFT) to the time series signals acquired by the data acquiring element 10 is taken as an adding number of times of the moving average filter a and the moving average filter b.

BRIEF SUMMARY

As described above, the load cell interface unit 1 of the present embodiment may specify an interval for setting the filter parameter in the interval specifying device 4a according to an instruction, i.e. an interval intend to eliminate an external interference such as vibration, etc. Moreover, the output signal (sampling data) of the specified interval can be logged in (recorded), and frequency analysis can be executed to determine a frequency of the external interference, so as to determine the filter parameter (for example, the adding number of times of the moving average filters).

In the past, in case of high-speed sampling frequency and data logging, the data amount becomes huge, and the storage capacity becomes inadequate. Therefore, in case of the high-speed sampling frequency, only one of methods of none logging or low-speed storage of the sampling frequency is adopted, and proper setting of the filter parameter probably cannot be implemented.

However, according to the method of the present embodiment, the interval to be logged is specified, so that the above problem is resolved, and the filter parameter can be properly set.

Embodiment 2

Another embodiment of the invention is provided below with reference of FIG. 2, FIG. 7 and FIG. 8. Moreover, to facilitate the description, regarding the components with the same functions as that of the components of the aforementioned embodiment, the same reference numbers denote the same or like components, and descriptions of the same technical contents are omitted.

A difference between the present embodiment and the embodiment 1 is that the specified interval used for determining the filter parameter is not specified by the user, but is specified by the controller 2.

Referring to FIG. 2(b) for an overall overview of the present embodiment. As shown in FIG. 2(b), the measuring system 100' of the present embodiment includes a load cell interface unit 1', the controller 2 and the load cell 3. The controller 2 uses the load cell 3 to measure a weight (or pressure) of a load of a work (measuring object), and controls the work according to a measuring result. Moreover, in the measuring system 100', the output signals of the interval specified by the controller 2 are used to set the filter parameter in the load cell interface unit 1'.

In this way, it is unnecessary to sample all of the output signals of the load cell 3. Therefore, even in case of a high sampling frequency, the output signals can be recorded without using a memory with a huge capacity.

(Load Cell Interface Unit)

Figure 7:
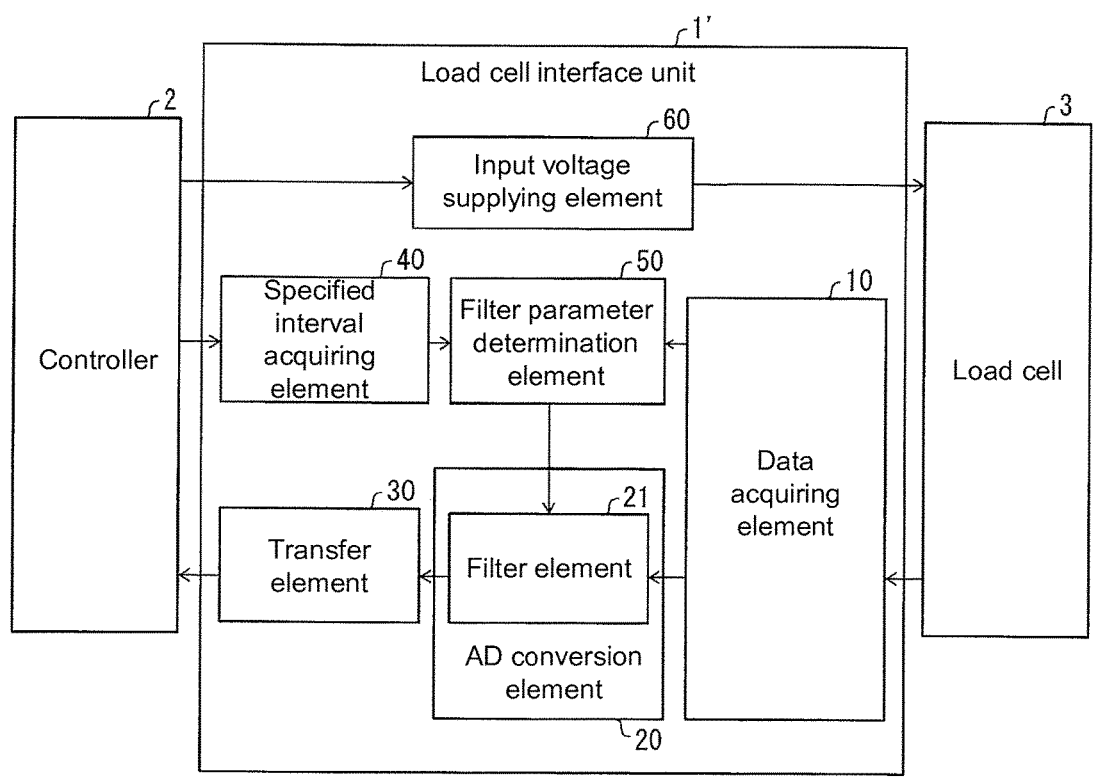
FIG. 7 is block diagram of a main structure of a load cell interface unit 1' according to an embodiment 2.

Referring to FIG. 7 for a main structure of the load cell interface unit 1' of the present embodiment, and FIG. 7 is block diagram of a main structure of the load cell interface unit 1' according to the present embodiment.

As shown in FIG. 7, in the load cell interface unit 1' of the present embodiment, the specified interval acquiring element 40 acquires the specified interval from the controller 2, and notifies the same to the filter parameter determination element 50. By using the controller 2 to specify the specified interval without waiting for the instruction of the user, setting of the filter parameter can be quickly performed.

Moreover, specifying of the specified interval can be implemented by the controller 2 in advance according to a property of the measuring object (work).

(Processing Flow for Setting the Filter Parameter)

Figure 8:
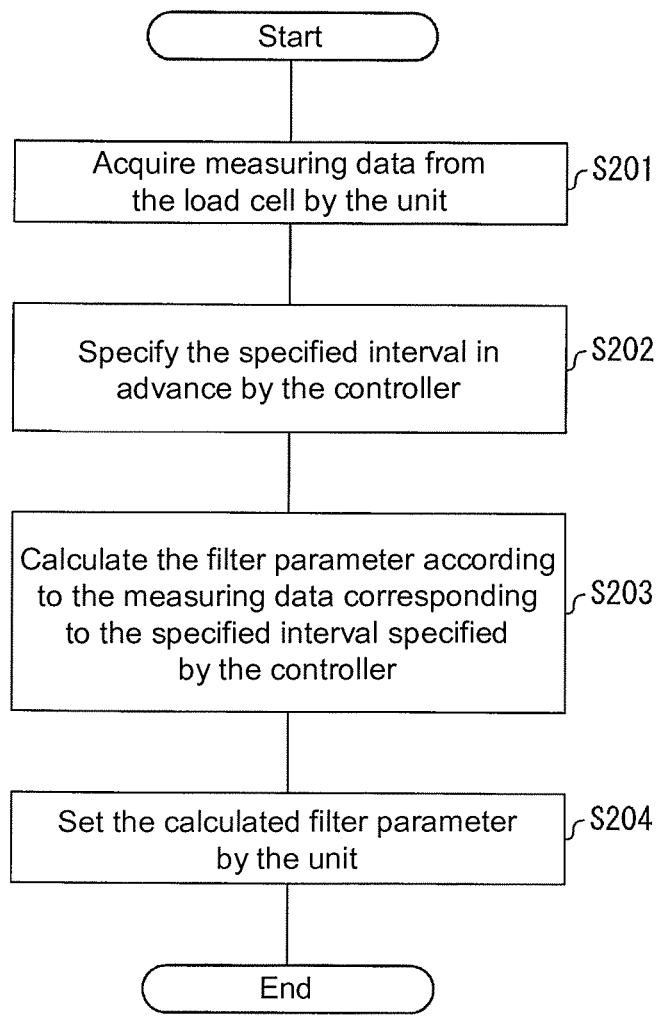
FIG. 8 is a flowchart illustrating a processing flow for setting the filter parameter.

Referring to FIG. 8 for the processing flow for setting the filter parameter of the present embodiment, and FIG. 8 is a flowchart illustrating a processing flow for setting the filter parameter.

As shown in FIG. 8, first, the load cell interface unit 1 acquires measuring data (output signal) from the load cell 3 (S201). Then, the controller 2 notifies the predetermined specified interval to the load cell interface unit 1 (S202).

The filter parameter determination element 50 in the load cell interface unit 1 that receives the notified specified interval from the controller 2 uses the measuring data corresponding to the specified interval to calculate the filter parameter (S203). Then, the load cell interface unit 1 sets the calculated filter parameter to the filter element 21 (S204).

The processing flow for setting the filter parameter is described above.

(Implementation Through Software)

Control modules (especially the AD conversion element 20 (the filter element 21) and the filter parameter determination element 50) of the load cell interface unit 1 can be implemented by logic circuits (hardware) formed on an integrated circuit (IC (chip)), and can also be implemented by using a central processing unit (CPU) through software.

In the later case, the load cell interface unit 1 has a CPU adapted to execute commands of software (i.e. procedures) capable of implementing various functions, a read only memory (ROM) or a storage device (referred to as a recording medium) recording the procedures and various data that can be read by a computer (or the CPU), a random access memory (RAM) for spreading the procedures, etc. Moreover, the procedures recorded in the recording medium can be read and executed by the computer (or the CPU) to achieve the purpose of the invention. The recording medium can be implemented by a non-temporary physical medium, for example, a tape, a disk, a card, a semiconductor memory, a programmable logic circuit, etc. Moreover, the procedure can be provided to the computer through any transmission medium (a communication network or a radio wave, etc.) capable of transmitting the procedure. In addition, the data embodying the procedure and embedded in carriers can be implemented in form of signals through teletransmission.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A signal processing device, adapted to filter signals coming from a sensor and transfer the signals to a control device, and the signal processing device comprising:
   a data acquiring circuitry, periodically acquiring the signals coming from the sensor, so as to obtain time series signals;
   a filter circuitry, filtering the time series signals acquired by the data acquiring circuitry according to frequencies;
   a transfer circuitry, transferring the time series signals filtered by the filter circuitry to the control device; and
   a filter parameter determination circuitry, performing frequency analysis to the time series signals within a specified interval to determine a filter parameter of the filter circuitry, the specified interval is specified based on the time series signals or by the control device,
   wherein the filter circuitry executes the filtering operation by using the filter parameter determined by the filter parameter determination circuitry.

2. The signal processing device as claimed in claim 1, further comprising:

a sensor data sending circuitry, sending sensor data representing the signals of the time series coming from the sensor to an external device, wherein the external device has a specification accepting element accepting specification of the specified interval from a user; and a specified interval acquiring circuitry, acquiring the specified interval specified based on the sensor data from the external device, wherein the filter parameter determination circuitry uses the time series signals within the specified interval acquired by the specified interval acquiring circuitry to determine the filter parameter.

3. The signal processing device as claimed in claim 1, wherein the filter parameter determination circuitry uses the time series signals within the specified interval to determine the filter parameter.

4. The signal processing device as claimed in claim 1, wherein the signal processing device determines whether to apply the filter parameter determined by the filter parameter determination circuitry to the filter circuitry.

5. The signal processing device as claimed in claim 1, wherein the filter parameter represents at least one of a type of a filter and a setting value applied to the filter for implementing the filtering operation.

6. The signal processing device as claimed in claim 1, wherein the filter circuitry has a plurality of filters, and
the signal processing device respectively determine whether to execute the filtering operation for the plurality of filters.

7. The signal processing device as claimed in claim 1, wherein the filter circuitry comprises moving average filters.

8. The signal processing device as claimed in claim 7, wherein the filter parameter determination circuitry takes a quotient of a period that the data acquiring circuitry acquires the signals divided by a peak frequency of a frequency characteristic obtained by performing the frequency analysis to the signals of the time series acquired by the data acquiring circuitry as an adding number of times of the moving average filters.

9. A control method of a signal processing device, adapted to filter signals coming from a sensor and transfer the signals to a control device, and the control method of the signal processing device comprising:

a data acquiring step, periodically acquiring the signals coming from the sensor, so as to obtain time series signals;

a filtering step, filtering the time series signals acquired in the data acquiring step according to frequencies; and a transfer step, transferring the time series signals filtered in the filtering step to the control device, the control method of the signal processing device further comprising:

a filter parameter determination step, performing frequency analysis to the time series signals within a specified interval to determine a filter parameter for the filtering operation of the filtering step, the specified interval is specified based on the time series signals or by the control device, and in the filtering step, the filtering operation is executed by using the filter parameter determined in the filter parameter determination step.

10. A signal processing device, adapted to filter signals coming from a sensor and transfer the signals to a control device, and the signal processing device comprising:

a processor configured to:

periodically acquire the signals coming from the sensor, so as to obtain time series signals, filter the time series signals according to frequencies, transfer the time series signals to the control device, and perform frequency analysis to the time series signals within a specified interval to determine a filter parameter, the specified interval is specified based on the time series signals or by the control device, wherein the processor configured to filter the time series signals is executed by using the filter parameter.

11. A non-transitory recording medium, recording a control procedure and adapted to be accessed by a computer, the control procedure is adapted to filter signals coming from a sensor and transfer the signals to a control device, the control procedure is adapted to be loaded to the computer to implement functions comprising:

a data acquiring step, periodically acquiring the signals coming from the sensor, so as to obtain time series signals;

a filtering step, filtering the time series signals acquired in the data acquiring step according to frequencies; and a transfer step, transferring the time series signals filtered in the filtering step to the control device, the functions further comprising:

a filter parameter determination step, performing frequency analysis to the time series signals within a specified interval to determine a filter parameter for the filtering operation of the filtering step, the specified interval is specified based on the time series signals or by the control device, and in the filtering step, the filtering operation is executed by using the filter parameter determined in the filter parameter determination step.

* * * * *